(12) United States Patent
Lee et al.

(10) Patent No.: US 9,245,639 B1
(45) Date of Patent: Jan. 26, 2016

(54) NAND FLASH MEMORY ARRAY ARCHITECTURE HAVING LOW READ LATENCY AND LOW PROGRAM DISTURB

(71) Applicant: Winbond Electronics Corporation, Taichung (TW)

(72) Inventors: Jong Oh Lee, San Jose, CA (US); Anil Gupta, Saratoga, CA (US); Dae Hyun Kim, San Ramon, CA (US)

(73) Assignee: Windbound Electronics Corporation, Taichung (TW)

( * ) Notice: Subject to any disclaimer, the term of this patent is extended or adjusted under 35 U.S.C. 154(b) by 0 days.

(21) Appl. No.: 14/512,813

(22) Filed: Oct. 13, 2014

(51) Int. Cl.
| | | |
|---|---|---|
| G11C 11/34 | (2006.01) |
| G11C 16/26 | (2006.01) |
| G11C 16/04 | (2006.01) |
| G11C 16/08 | (2006.01) |
| G11C 16/10 | (2006.01) |

(52) U.S. Cl.
CPC ............. *G11C 16/26* (2013.01); *G11C 16/0483* (2013.01); *G11C 16/08* (2013.01); *G11C 16/10* (2013.01)

(58) Field of Classification Search
CPC ..... G11C 16/10; G11C 16/26; G11C 16/0483
USPC ...................... 365/185.12, 185.11, 230.03, 63
See application file for complete search history.

(56) References Cited

U.S. PATENT DOCUMENTS

| 7,061,802 B2 * | 6/2006 | Nakai ................. G11C 7/1051 257/E27.103 |
| 7,558,900 B2 | 7/2009 | Jigour et al. |
| 8,279,673 B2 * | 10/2012 | Furuyama .......... G11C 16/0483 365/185.17 |
| 8,667,368 B2 | 3/2014 | Gupta et al. |
| 2013/0346671 A1 | 12/2013 | Michael et al. |
| 2014/0269065 A1 | 9/2014 | Jigour et al. |

OTHER PUBLICATIONS

Winbond Electronics Corporation. W25N01GV spiflash 3V 1G-Bit Serial SLC Nand Flash Memory with Dual/Quad SPI & Continuous Read, Preliminary Revision B, Nov. 26, 2013. 69 Pages.
Winbond Electronics Corporation. W25Q128FV spiflash 3V 128M-Bit Serial Flash Memory with Dual/Quad SPI & QPI, Revision D, Oct. 1, 2012. 97 Pages.

* cited by examiner

*Primary Examiner* — Son Dinh
(74) *Attorney, Agent, or Firm* — David H. Carroll

(57) ABSTRACT

A NAND flash memory achieves low read latency and avoidance of inadvertent programming and program disturb so that the random access and initial page read speeds of the NAND flash memory are generally comparable to that of a NOR flash memory, while preserving the higher memory density and lower power operation characteristics of traditional NAND flash memory relative to NOR flash memory. The reduction in latency is achieved by a NAND memory array architecture which employs a small NAND string, a dual plane interleaved memory architecture, a partitioned NAND array, selectively coupled local bit lines per each global bit line, and a counter-biasing mechanism to avoid inadvertent programming and program disturb.

9 Claims, 5 Drawing Sheets

NAND FLASH MEMORY ARRAY ARCHITECTURE HAVING LOW READ LATENCY AND LOW PROGRAM DISTURB

BACKGROUND OF THE INVENTION

1. Field of the Invention

The present invention relates to digital memory devices and operation thereof, and more particularly to a NAND flash memory array architecture having low read latency and low program disturb.

2. Description of Related Art

NAND flash memory is popular for data storage. The cost versus density advantage of single level cell ("SLC") NAND flash memory in densities of 512 Megabits and higher is largely due to the inherently smaller memory cell size used in SLC NAND flash technology.

NAND flash memory is also becoming popular for a variety of applications beyond data storage due to various techniques which have been developed to adapt NAND flash memory to such applications. Unfortunately, NAND flash memory tends to have a lengthy read latency time, which limits the usefulness of NAND flash memory in applications requiring random data access and short sequential and continuous page reads.

BRIEF SUMMARY OF THE INVENTION

One embodiment of the present invention is a NAND flash memory comprising: an input/output bus; and a plurality of memory planes arranged in pairs, the memory planes in each pair being configured to be alternatively coupled to the input/output bus; each of the memory planes comprising an X decoder, a page buffer, and a NAND array comprising a plurality of word lines arranged in rows and coupled to the X-decoder, a plurality of global bit lines coupled to the page buffer, and a plurality of flash memory cells coupled along the rows to the word lines; the NAND array for each of the memory planes comprising a plurality of partitions through which the global bit lines pass; each of the partitions comprising a subset of the word lines, a plurality of local bit lines arranged in columns, and a subset of the flash memory cells arranged in a plurality of strings, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node.

Another embodiment of the present invention is a NAND flash memory comprising: an input/output bus; an X decoder; a page buffer; a NAND array comprising a plurality of word lines arranged in rows and coupled to the X-decoder, a plurality of global bit lines coupled to the page buffer, and a plurality of flash memory cells coupled along the rows to the word lines, the flash memory cells being arranges in a plurality of strings; a plurality of local bit lines arranged in columns, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node; and control logic. The control logic is configured to carry out the steps of: identifying a selected one of the word lines in accordance with a memory address; identifying a row of the strings having flash memory cells coupled to the selected word line; coupling the identified strings to the respective local bit lines associated therewith; coupling to each of the global bit lines one of the local bit lines associated therewith and with which one of the identified strings is associated; coupling to the variable bias node others of the local bit lines having respective ones of the identified strings associated therewith and not coupled to the global bit lines associated therewith; for each of the global bit lines, establishing either a first bias indicative of a first digital value or a second bias indicative of a second digital value different than the first digital value; establishing a third bias on the selected word line; establishing a fourth bias on word lines coupled to cells within the identified strings other than the selected word line, the flash memory cells having channel regions and the flash memory cells in the identified strings having the fourth bias capacitively coupled to the channel regions thereof; and establishing a fifth bias on the variable bias node. The third bias and a channel potential established by the first bias are effective to enable tunneling in the flash memory cells. The third bias and a channel potential established by the second bias and the capacitively coupled fourth bias are effective to disable tunneling in the flash memory cells. The third bias and a channel potential established by the fifth bias and the capacitively coupled fourth bias are effective to disable tunneling in the flash memory cells.

Another embodiment of the present invention is a method of operating a NAND flash memory comprising an X decoder, a page buffer, and a NAND array comprising a plurality of word lines arranged in rows and coupled to the X-decoder, a plurality of global bit lines coupled to the page buffer, and a plurality of flash memory cells arranged in strings and coupled along the rows to the word lines, the method comprising: identifying a selected one of the word lines in accordance with a memory address; identifying a row of the strings having flash memory cells coupled to the selected word line, the strings being respectively associated with a plurality of local bit lines, and groups of the local bit lines being respectively associated with the global bit lines; coupling the identified strings to the respective local bit lines associated therewith; coupling to each of the global bit lines one of the local bit lines associated therewith and with which one of the identified strings is associated; coupling to the variable bias node others of the local bit lines having respective ones of the identified strings associated therewith and not coupled to the global bit lines associated therewith; for each of the global bit lines, establishing either a first bias indicative of a first digital value or a second bias indicative of a second digital value different than the first digital value; establishing a third bias on the selected word line; establishing a fourth bias on word lines coupled to cells within the identified strings other than the selected word line, the flash memory cells having channel regions and the flash memory cells in the identified strings having the fourth bias capacitively coupled to the channel regions thereof; and establishing a fifth bias on the variable bias node. The third bias and a channel potential established by the first bias are effective to enable tunneling in the flash memory cells. The third bias and a channel potential established by the second bias and the capacitively coupled fourth bias are effective to disable tunneling in the flash memory cells. The third bias and a channel potential established by the fifth bias and the capacitively coupled fourth bias are effective to disable tunneling in the flash memory cells.

DETAILED DESCRIPTION OF THE INVENTION

To be competitive with NOR flash memory devices in certain applications, NAND memory devices should have certain characteristics, including: (1) the multi-I/O SPI/QPI interface; (2) small low pin count package types (as small as 8×6 mm at densities of 256 Mb and higher) such as, for example, the 8-contact WSON, 16-pin SOIC, and the 24-ball BGA type packages, with the flexibility of using larger packages such as VBGA-63 typically used with ordinary parallel and ordinary serial NAND flash memory; (3) high clock frequency operation (illustratively 104 MHz) for high transfer rates (illustratively 50 MB/Sec); (4) continuous read with Error Correction Code ("ECC") processing across page boundaries without wait intervals, for fast code shadowing applications; (5) logically contiguous addressable good memory through bad block management which is transparent to the external systems and which is without adverse impact on the speed and continuity of the output; and (6) an output starting address of zero or alternatively any other address within the user-addressable space of the memory array via a user-specified or manufacturer-specified value.

A further desirable characteristic is low read latency. Unfortunately, NAND flash memory tends to have a lengthy read latency time, typically of about twenty microseconds, which adversely affects performance in certain applications which require random byte reads and short sequential and continuous page reads for which NOR flash memory is so suitable. The lengthy latency time is attributable to the substantial word line and bit line resistive-capacitive ("RC") delay and the small cell current typical of NAND flash memory cell arrays, which typically use NAND string sizes of 32 cells and word lines of 2 KB (kilobytes) and greater. Advantageously, the techniques described herein reduce the read latency so that the random access and initial page read speeds of the NAND flash memory are generally comparable to that of a NOR flash memory, while preserving the higher memory density and lower power operation characteristics of traditional NAND flash memory relative to NOR flash memory. The reduction in latency is achieved by a NAND memory array architecture which employs a smaller NAND string to avoid degradation of the small read current, a dual plane interleaved memory architecture in which each plane may be relatively small and therefore employ word lines and bit lines having low RC delays while achieving gapless reads across page and block boundaries, and a counter-biasing mechanism to avoid inadvertent programming and program disturb.

Figure 1:
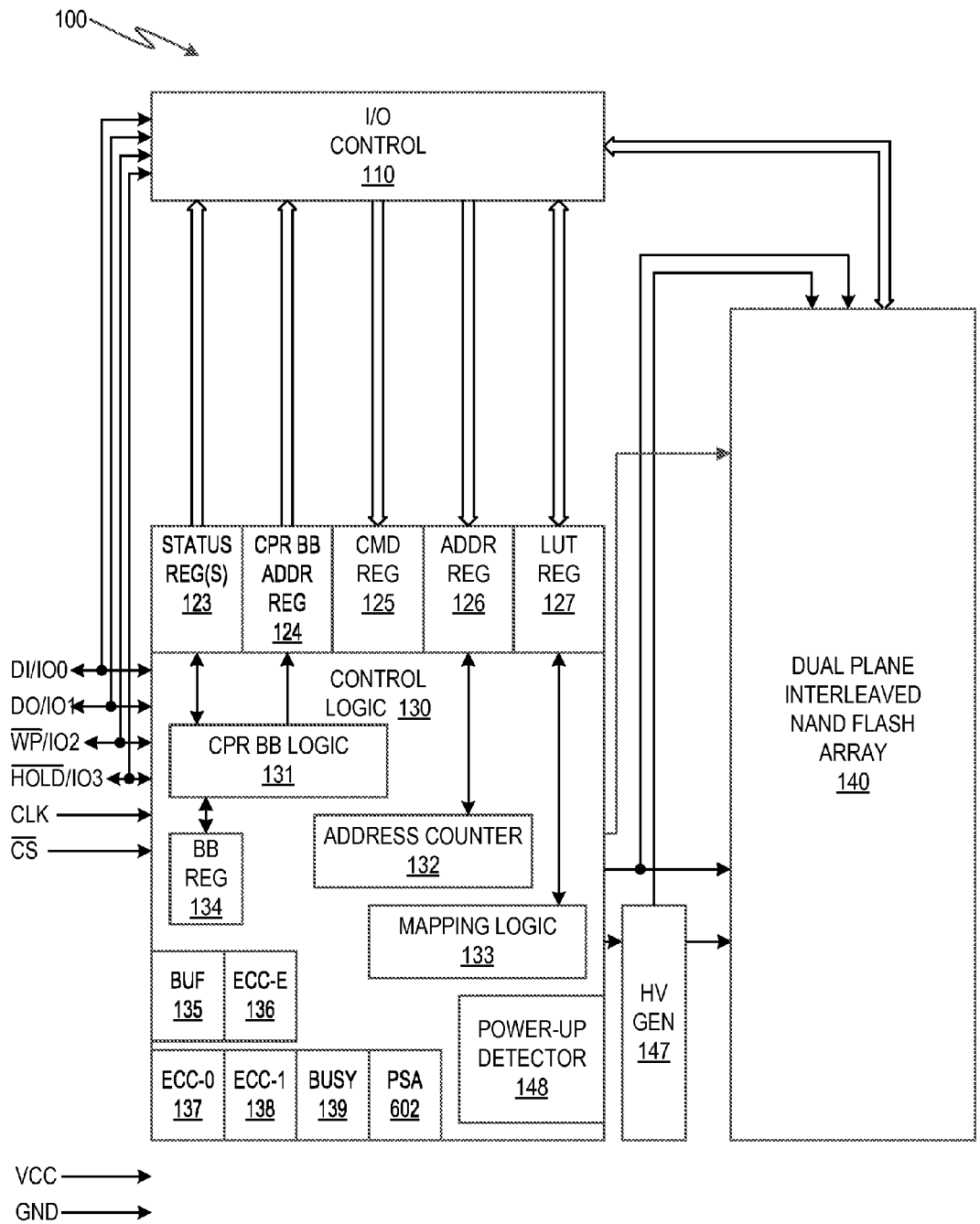
FIG. 1 is a block schematic diagram of an illustrative serial NAND flash memory.

FIG. 1 is a block schematic diagram of an illustrative serial NAND flash memory 100 which is capable of providing a continuous read across page boundaries and from logically contiguous memory locations without wait intervals, along with bad block management and ECC processing. The serial NAND flash memory 100 includes a dual plane interleaved NAND flash array 140, which includes various peripheral circuitry such as X-decoders and page buffers, and which may store various types of data in addition to user data, such as identification data, control data, macro-data, and redundant block information and lookup table information for bad block management, Any desired flash memory cell technology may be used for the flash memory cells of the NAND flash array 140. The serial NAND flash memory 100 may include various other circuits to support memory programming, erase and read, such as I/O control 110, status register(s) 123, continuous page read ("CPR") bad block address register(s) 124, command register 125, address register 126, a LUT register 127, control logic 130, CPR bad block logic 131, a CPR bad block register 134, and high voltage generators 147. A power-up detector 148 is provided in the control logic 130 to initiate the setting of a particular mode and the loading of a default page upon power-up. The control logic 130 may be implemented in any suitable manner, and may include hardware components, software components, firmware components, and any combination thereof. Power is supplied (not shown) throughout the circuits of the serial NAND flash memory 100 by power lines VCC and GND. While the NAND flash memory 100 may be packaged in any desired manner and may have any type of interface, including ordinary NAND flash memory interfaces, the control logic 130 of FIG. 1 illustratively implements the SPI/QPI protocol, including the multi-IO SPI interface. Additional detail on the SPI/QPI interface and on some of the various circuits of the memory may be found in U.S. Pat. No. 7,558,900 issued Jul. 7, 2009 to Jigour et al. entitled "Serial Flash Semiconductor Memory," and in a data sheet by Winbond Electronics Corporation, W25N01GV SpiFlash 3V 1G-Bit Serial SLC NAND Flash Memory with Dual/Quad SPI & Continuous Read, Preliminary Revision B, Nov. 26, 2013, which hereby are incorporated herein in their entirety by reference thereto.

An ECC circuit (not shown) may be provided to perform ECC computations on the contents of the page buffers depending on the status of an ECC-E flag 136. ECC status bits ECC-0 137 and ECC-1 138 are provided to indicate the error condition of the data, and may be checked to verify the data integrity. The ECC-E 136, ECC-0 137 and ECC-1 138 bits may be provided as part of the status register(s) if desired.

BUSY 139 is a read only bit in the status register that is set to a 1 state when the device is powering up or executing various instructions, including the Page Data Read instruction and the Continuous Read instruction.

Figure 2:
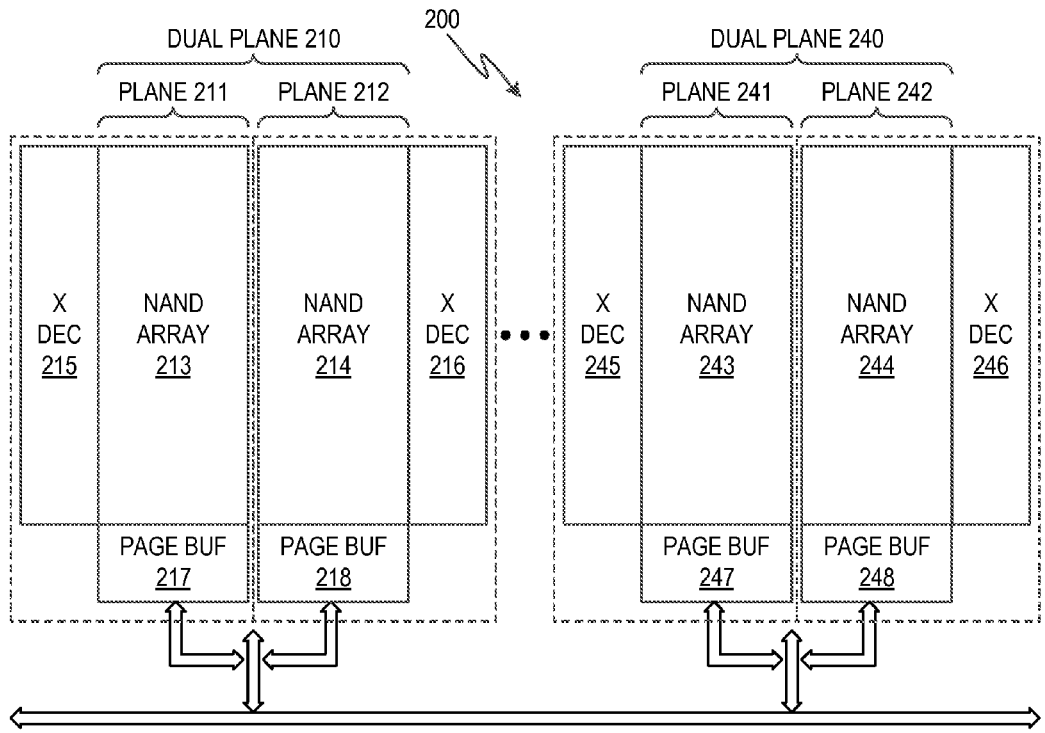
FIG. 2 is a block schematic diagram of a dual plane interleaved NAND flash memory array architecture suitable for use in the serial NAND flash memory of FIG. 1.
Figure 3:
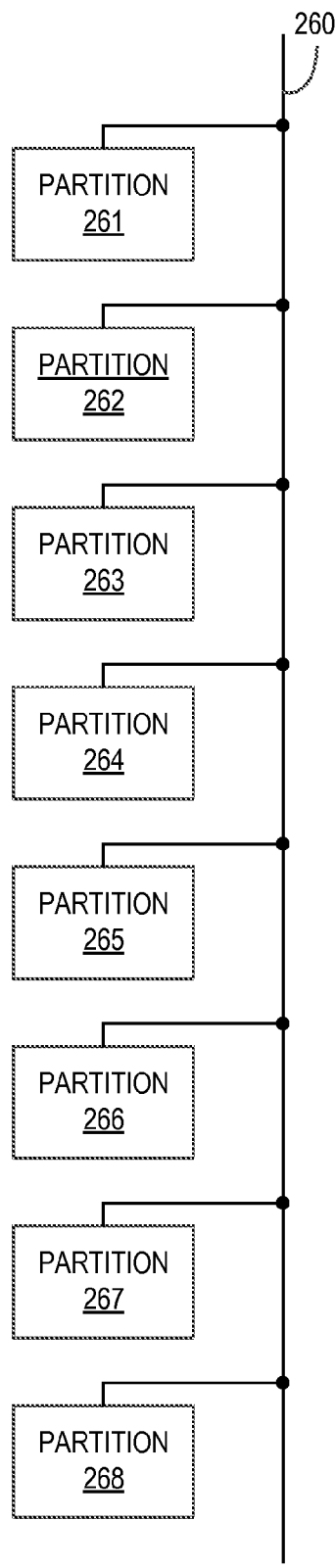
FIG. 3 is a block schematic diagram of an illustrative partitioning of cells in a plane of the NAND flash memory array architecture of FIG. 2.

FIG. 2 is a block schematic diagram of a NAND flash memory array architecture 200 suitable for use as the array 140 (FIG. 1). The architecture 200 may have multiple dual planes (two such dual planes 210 and 240 are shown), and each of the planes may be arranged in a number of partitions (illustratively eight partitions 261-268 as shown in FIG. 3), each of a size suitable for operating with a small sensing budget. Illustratively, the architecture 200 may have four dual planes (two such dual planes 210 and 240 are shown, respectively having planes 211 and 212, and planes 241 and 242), and achieves a sensing time budget of 100 nanoseconds ($\eta$s) or less by operationally partitioning the plane and restricting the size of each of the partitions so that the combined word line and bit line RC delay in the plane is 20 $\eta$s or less. Illustratively, employing the techniques described herein, each plane may have a 64 Mb NAND array which achieves a sensing time budget of less than about 100 nanoseconds ($\eta$s), and eight such planes may be arranged in a dual plane arrangement to achieve a memory size of 512 Mb.

The architecture 200 includes an X-decoder and a page buffer for each NAND flash array in a plane, illustratively X-decoder 215 and page buffer 217 for the NAND array 213 in plane 211, X-decoder 216 and page buffer 218 for the NAND array 214 in the plane 212, X-decoder 245 and page buffer 247 for the NAND array 243 in the plane 241, and X-decoder 246 and page buffer 248 for the NAND array 244 in the plane 242. The overhead added by the X-decoders is relatively minor, the size of the page buffers for the first planes is relatively small at one-eighth of a full page (for example, 512 bits each or 2K bits for all four of the first plane page buffers, for a 2K byte page), and the size of the page buffers for the second planes also is relatively small at one-eighth of a full page. The input/output bus may be any suitable width, illustratively 8, 16 or 32 bits.

FIG. 3 is a block schematic diagram of an illustrative partitioning of cells in the NAND flash memory array architecture 200. Illustratively, eight partitions 261-268 having respective connections to global bit lines 260 may be used. Each of the partitions contains local bit lines, illustratively four for each global bit line (see FIG. 4), which are individually capable of being selected or unselected. In this way, the addressed data in one partition may be read out by initially selecting an appropriate one of the local bit lines associated with each global bit line in the partition containing the addressed data, while unselecting the other local bit lines associated with that global bit line, and while also unselecting all local bit lines in the other partitions not containing the addressed data. In this manner, a large plane size may be realized while keeping the RC delay on the local bit lines (not shown) and on the global bit lines 260 low. The RC delay of the global bit lines 260 may be reduced by segmenting the global bit line and strapping the segments between the partitions using an upper conductive layer having a very low RC delay, such as, for example, a metal layer.

Figure 4:
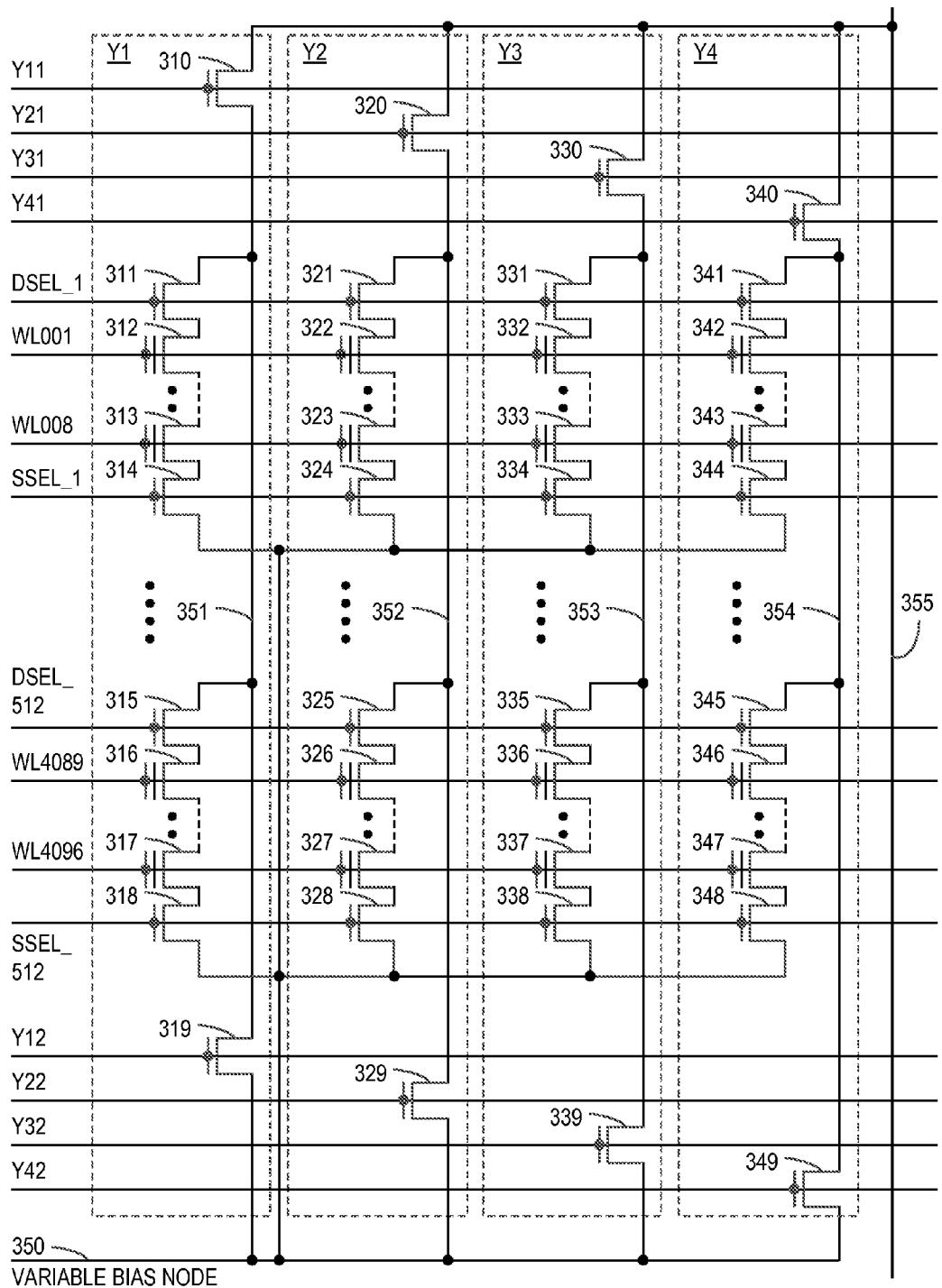
FIG. 4 is a circuit schematic diagram of an illustrative embodiment of one of the partitions shown in FIG. 3.

FIG. 4 is a circuit schematic diagram of an illustrative partition such as shown in FIG. 3. Illustratively, the partition of FIG. 4 includes four operationally selectable local bit line groups Y1, Y2, Y3 and Y4. Each of the groups Y1, Y2, Y3 and Y4 includes a local bit line (respectively 351, 352, 353, 354), a top select transistor (respectively 310, 320, 330, 340), a bottom select transistor (respectively 319, 329, 339, 349), and 512 strings respectively connected to the local bit line. Each of the strings contains a drain select transistor (illustratively 311, 321, 331, 341, 315, 325, 335, 345), eight flash memory cells (illustratively 312, 313, 322, 323, 332, 333, 342, 343, 316, 317, 326, 327, 336, 337, 346, 347), and a source select transistor (illustratively 314, 324, 334, 344, 318, 328, 338, 348). Illustratively, the first string in the group Y1 containing flash memory cells 312 and 313 is addressed by word lines WL001-WL008, while the last string in the group Y1 containing memory cells 316 and 317 is addressed by word lines WL4089-WL4096. Similarly, the first string in the group Y2 containing flash memory cells 322 and 323 is addressed by word lines WL001-WL008, while the last string in the group Y2 containing memory cells 326 and 327 is addressed by word lines WL4089-WL4096. Similarly, the first string in the group Y3 containing flash memory cells 332 and 333 is addressed by word lines WL001-WL008, while the last string in the group Y3 containing memory cells 336 and 337 is addressed by word lines WL4089-WL4096. Similarly, the first string in the group Y4 containing flash memory cells 342 and 343 is addressed by word lines WL001-WL008, while the last string in the group Y4 containing memory cells 346 and 347 is addressed by word lines WL4089-WL4096.

The use of 8 bits in a string is advantageous in that it provides a reasonable flash memory cell density in the Y-direction along with a reduced bit line discharge time. However, if desired, a smaller string size of 2 or 4 flash memory cells, and a larger string size of 16 flash memory cells may be used while still offering improved current performance relative to the common 32 cell strings.

To carry out read and program operations, the top and bottom select transistors (310 and 319 in group Y1, 320 and 329 in group Y2, 330 and 339 in group Y3 and 340 and 349 in group Y4) control the selection of the groups within the partition containing the addressed data, so that the data may be interleaved from the local bit lines (local bit lines 351, 352, 353 or 354) onto global bit line 355 during read operations with a variable bias node 350 providing a source bias, and so that a suitable counter-bias may be applied from the variable bias node 350 to the drains of certain flash memory cells during programming to prevent them from programming or from program disturb. The bit line RC delay for the memory thereby is essentially limited to the RC delay of the global bit line without any local bit line contribution, plus the RC delay of one local bit line, namely the selected local bit line.

A read operation may be performed as follows: (a) the global bit line is pre-charged and the source is at ground; (b) for the groups which do not contain any cells to be read, the top and bottom select transistors are biased off; and (c) for the group containing the cell to be read, the top and bottom select transistors are biased on, the drain and source select transistors for the string containing the cell to be read are biased on, and the drain and source select transistors for the strings which do not contain any cells to be read are biased off.

A program operation is conducted using channel tunneling, and may be performed as follows: (a) the top select transistor of each group which contains a cell to be programmed is biased on, and the bottom select transistor of each group which contains a cell to be programmed is biased off; (b) the top select transistor of each group which does not contain a cell to be programmed is biased off, and the bottom select transistor of each group which does not contain a cell to be programmed is biased on; (c) the drain transistors of the strings containing cells on the selected word line are biased on, and the source transistors of these string are biased off; (d) the drain and source transistors of the strings within the group not containing any cells on the selected word line may be biased off; (e) the global bit line and local bit line of the selected group are biased at a suitable voltage relative to the selected word line voltage to enable channel tunneling (illustratively 0 volts) and the source is biased at a suitable counter-bias relative to the selected word line voltage to disable channel tunneling (illustratively 3 volts); (f) the selected word line which runs to cells in the selected group as well as in the non-selected groups is sufficiently biased to enable channel tunneling (illustratively about 15 to 20 volts with the substrate (illustratively a p-well) at 0 volts); and (g) if self-boosting is desired, the word lines other than the selected word line may be biased to increase the channel voltage of the cells other than the cell being programmed (illustratively about 8 to 10 volts). Alternatively, other types of biasing may be used on the word lines other than the selected word line; for example, only the word lines controlling the cells in the strings between the cells on the selected word line and the drain transistors of the strings may be biased to ensure that they are on regardless of their threshold voltage, but not at a sufficient level to cause programming (illustratively about 8 to 10 volts), which biases the drain of the cell to be programmed and aids in channel tunneling.

The voltages stated herein are provided by way of example and not limitation, and variations may be used even while carrying out the same principle. With that said, based on the voltages stated herein, the cell to be programmed has 20 volts on its gate, zero volts on its drain and channel, and a floating source, whereby channel tunneling occurs to establish a positive threshold voltage in the cell. The cells in the same string as the cell to be programmed have at most about 8 to 10 volts on their control gates, which is insufficient to cause an undesired programming or program disturb. The cells in strings which do not include the selected word line have at most about 8 to 10 volts and possibly 0 volts on their control gates, which is insufficient to cause an undesired programming or program disturb.

The cells on the selected word line but which are not to be programmed may be protected from undesired programming or program disturb by using a counter-bias voltage provided on the variable bias node 350, and applied to the drain of the cell on the selected word line through the lower select transistor for the group, the drain transistor of the string, and the intervening flash memory cells, if any, all of which are biased on. If self-boosting is used and 10 volts are used on the non-selected word lines, about 5 volts are coupled to the channel, so that the counter-bias voltage may raise the channel potential in the cell to about 8 volts (about 3 volts initial bias plus about 5 volts due to coupling), which is a sufficient counter-bias against 20 volts on the control gate to prevent programming.

A specific example is now provided with reference to FIG. 4, to illustrate the principles described herein. Assume, for example, that transistor 313 is to be programmed; that is, give a positive threshold voltage. In group Y1, the top select transistor 310 is biased on, the bottom select transistor 319 is biased off, drain select transistor 311 is biased on, source select transistor 314 is biased off, global bit line 355 is biased at 0 volts, WL008 is biased at 20 volts, word lines WL001 through WL007 (WL002 through WL007 not shown) are biased at 10 volts, and WL009 (not shown) through WL4096 are biased at 0 volts. In group Y2, the top select transistor 320 is biased off, the bottom select transistor 329 is biased on, drain select transistor 321 is biased on, source select transistor 324 is biased off, the source line is biased at 3 volts, and word lines WL001 through WL4096 are biased as described above. The various voltages in groups Y3 and Y4 are similar to the voltages in group Y2.

Figure 5:
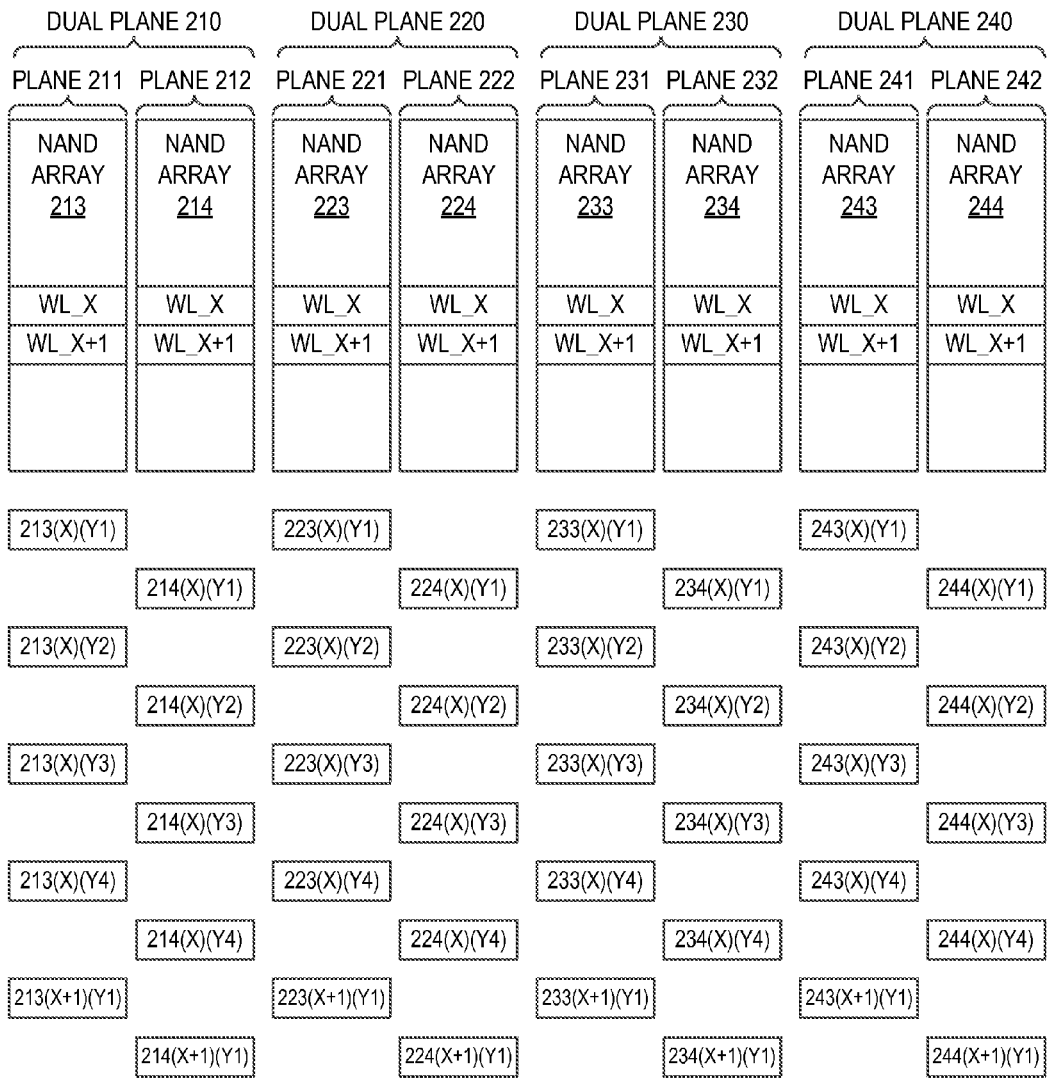
FIG. 5 is a block diagram which shows the interleaved read operation of the dual plane NAND flash memory array architecture of FIG. 2.

FIG. 5 is a block diagram which shows the interleaved read operation of the dual plane architecture 200 (FIG. 2). A Plane Select Address ("PSA") bit 602 (FIG. 1) indicates whether the read operation is to begin from the first plane of a dual plane set (for example, plane 211 of the dual plane 210, and plane 241 of the dual plane 240) or from the second plane of a dual plane set (for example, plane 212 of the dual plane 210, and plane 242 of the dual plane 240). The value of PSA bit 602 depends on the read starting address. When PSA is "0" for example, the read may start from a particular word line in the first planes, and may continue onto the same word line in the second planes. When PSA is "1" for example, the read may start from a particular word line in the second planes, and may continue onto the next or adjacent word line in the second planes. Within each plane, seven of the eight partitions are unselected at any given time, and within the partition containing the addressed data, three of the local bit line groups are unselected at any given time while only one of the four local bit line groups is selected.

Suppose, for example, that a Page Read Instruction specifies an address in the first planes. This resets PSA to 0. The word line is selected of a particular partition control of four groups of memory cells (illustratively groups Y1, Y2, Y3 and Y4 as shown in FIG. 4). Assume that the specified address corresponds to WL_X. First, one of the four groups Y1 in the first planes selected by WL_X respectively output 512 bits from their flash memory cells onto the global bit lines, so that 512 bits are stored in the respective 512 bit page buffers for the four first planes, as indicated by 213(X)(Y1), 223(X)(Y1), 233(X)(Y1) and 243(X)(Y1), after a short latency of not more than 100 ηs. For the initial loading operation, the four groups Y1 in the second planes selected by WL_X respectively output 512 bits from their flash memory cells onto the global bit lines, concurrently with the four groups Y1 in the first planes, so that 512 bits are also stored in the respective 512 bit page buffers for the four second planes, as indicated by 214(X)(Y1), 224(X)(Y1), 234(X)(Y1) and 244(X)(Y1). The resulting 2K bits of data in the first plane page buffers may then be output beginning at any byte boundary, and the resulting 2K bits of data in the second plane page buffers may be output at any time upon completion of the output from the first plane buffers, without any gap.

Essentially concurrently with the output of data from the second plane page buffers, the four groups Y2 in the first planes selected by WL_X respectively output 512 bits from their flash memory cells onto the global bit lines, so that 512 bits are stored in the respective 512 bit page buffers for the four first planes, as indicated by 213(X)(Y2), 223(X)(Y2), 233(X)(Y2) and 243(X)(Y2). The resulting 2K bits of data in the first plane page buffers may be output at any time upon completion of the output from the second plane buffers, without any gap.

As shown in FIG. 5, this process continues through groups Y2, Y3 and Y4, and then the word line is advanced to WL_X+1 and the process continues in like manner until terminated.

Advantageously, the read may begin on any byte boundary of any plane with a sensing latency of 100 ηs or less, which supports random reads, and may proceed in a continuous manner without gaps until terminated by the user, which supports continuous page reads.

The page buffer may use a pitch of 4 cells which helps reduce the page buffer area when the global bit line to local bit line ratio is 1:4. A 1:4 ratio may involve the use of NOP=4, which is easily achievable with SLC.

The speed bottleneck is due to initial sensing time, which can be helped with a higher number of dummy clocks (illustratively 12 or more) in the case of SPI-NOR emulation.

Figure 6:
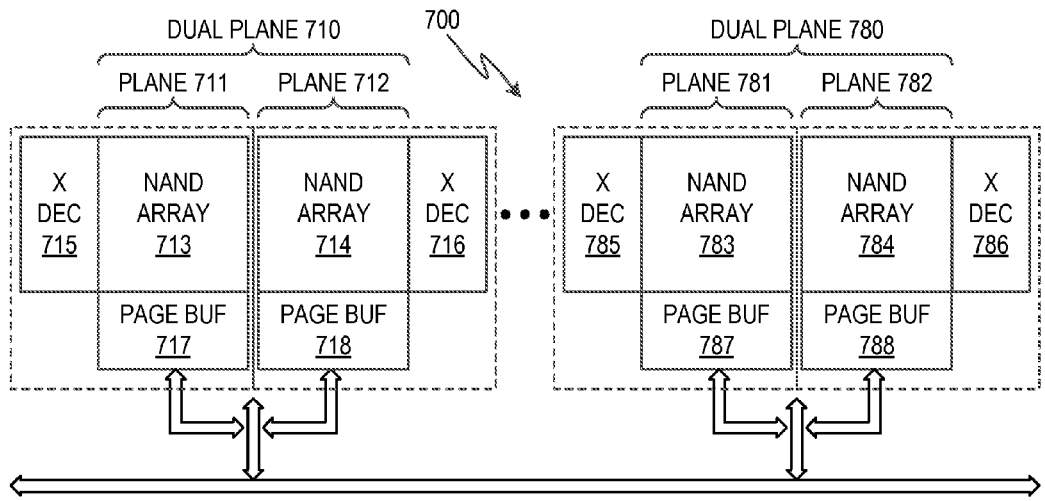
FIG. 6 is a block schematic diagram of a dual plane interleaved NAND flash memory array architecture having a small size limitation.

FIG. 6 is a schematic block diagram of a dual plane interleaved flash memory array architecture suitable for smaller memories of about 256M bits or less, but which is not entirely satisfactory for larger memories. Illustratively, the architecture 700 may have eight dual planes represented by first and eighth dual planes 710 and 780, which include first planes 711 and 781 respectively, and second planes 712 and 782 respectively. The architecture 700 achieves a sensing time budget of less than about 100 nanoseconds (ηs) by restricting the size of each of the NAND array planes 711, 712, . . . , 781, 782 so that the combined word line and bit line RC delay in the plane is 20 ηs or less, and so that either the same or adjacent word lines are selected in dual planes. Illustratively, each plane contains 4K flash memory cells on each bit line in the Y-direction arranged as 512 selectable strings of 8 cells each, and 2K bits on each word line in the X-direction, for a plane size of 8M bits. The size of a memory having eight double planes, therefore, is 128M bits. The dual plane architecture supports random read and continuous page read while allowing for a smaller plane size and therefore smaller word lines and bit lines in each plane, to bring the combined word line and bit line RC delay in the plane to 20 ηs or less, and the overall sensing time budget of 100 ηs or less. However, the overhead added by the page buffers 717, 718, . . . , 787 and 788 is significant, since each is illustratively 2K bits and there are sixteen of them. The input/output bus may be any suitable width, illustratively 8, 16 or 32 bits.

The architecture 700 may be read using an interleaved read generally in the manner shown and described in FIG. 5 and associated text, except that global bit lines and selectable groups within each partition need not be used. A Plane Select Address ("PSA") bit 602 (FIG. 1) indicates whether the read operation is to begin from the first plane of a dual plane set (for example, plane 711 of the dual plane 710, and plane 781 of the dual plane 780) or from the second plane of a dual plane set (for example, plane 712 of the dual plane 710, and plane 782 of the dual plane 780). The value of PSA bit 602 depends on the read starting address.

Suppose, for example, that a Page Read Instruction specifies an address in the first planes. This resets PSA to 0. Assuming that the specified address corresponds to WL_X, 2K bits are loaded into each of the page buffers for each of the first planes after a short latency of not more than 100 ηs. At the same time, the 2K bits on WL_X in the second planes are loaded into each of the page buffers for each of the second planes. Output may begin in accordance with the read address from any byte boundary in the page buffers of the first planes, and output from the page buffers of the second planes may begin immediately upon completion of output from the page buffers of the first planes, without any gap.

The read operation may continue by advancing the active word line to WL_X+1 and loading 2K bits into the page buffers for the first planes while the output from the page buffers of the second planes is in progress. Output from the page buffers of the first planes may begin immediately upon completion of output from the page buffers of the second planes, without any gap. The read operation continues in the same manner until terminated.

Suppose, for example, that a Page Read Instruction specifies an address in the second planes. This sets PSA to 1. The process is essentially the same as described for PSA=0, except that for the initial loading, 2K bits selected by WL_X in the second planes are loaded into the page buffers for the second planes, while concurrently 2K bits selected by WL_X+1 in the first planes are loaded into the page buffers for the first planes.

The page buffers of the first and second planes (illustratively represented by 217, 218, 247 and 248 in FIG. 2, and 717, 718, 787 and 788 in FIG. 6) may be implemented with a data register and a cache register using a two level latch. Any suitable latch or memory technology may be used for the data register and the cache register, and any suitable gating technology may be used for replicating data from the data register to the cache register. Various on-chip bad block management techniques and error correction code processing techniques described for two level latches in U.S. Pat. No. 8,667,368 Issued Mar. 4, 2014 to Gupta et al. and entitled "Method and Apparatus for Reading NAND Flash Memory," US Patent Application Publication No. 2013/0346671 published Dec. 26, 2013 in the name of Michael et al. and entitled "On-Chip Bad Block Management for NAND Flash Memory," and US Patent Application Publication No. US 2014/0269065 published Sep. 18, 2014 in the name of Jigour et al. and entitled "NAND Flash Memory," all of which hereby are incorporated herein in their entirety by reference thereto, and while described for partitioned data and cache registers, these techniques may be adapted for use with non-partitioned registers.

In view of the full 2K byte per page size of the page buffers used for the first planes and for the second planes of the architecture of FIG. 6 (illustratively represented by 717, 718, 787 and 788), the layout overhead for the page buffers of FIG. 6 in particular is quite large. The layout overhead of the page buffers of the first and second planes (illustratively represented by 217, 218, 247 and 248 in FIG. 2, and 717, 718, 787 and 788 in FIG. 6) may be reduced by implementing the page buffers as single level latches, although at the loss of the benefits of two level latches.

It will be appreciated that the example of a 2K byte page size and other specific sizes are illustrative, and may be varied in a manner consistent with the teachings herein. Moreover, the specific size reference is not to be taken literally, since the actual page size may vary depending on design factors; for example, the term may include a 2,048 Byte main area plus an additional 64 Byte spare area, where the spare area is used for storing ECC and other information such as meta data. In the same way, the term 1 KB may refer to a 1,024 Byte main area and a 32 Byte spare area FIG. 1 also shows control signals /CS, CLK, DI, DO, /WP and /HOLD which are for the SPI interface. The standard SPI flash interface provides /CS (chip select—complement), CLK (clock), DI (serial data-in), and DO (serial data-out) signals, along with optional signals /WP (write protect—complement) and /HOLD (hold—complement). While the 1-bit serial data bus (data-in through DI and data-out through DO) in the standard SPI interface provides a simple interface and compatibility with many controllers which boot up in single SPI mode, it is limited in achieving higher read thru-put. A multi-bit SPI interface therefore evolved to additionally support dual (2-bit interface) and/or quad (4-bit interface) for increased read thru-put. FIG. 1 also shows additional data bus signals for Dual SPI and Quad SPI operation, i.e. I/O(0), I/O(1), I/O(2), and I/O(3), by selectively redefining the function of four pins. In one illustrative version of the Quad SPI read operation (other versions may be envisioned), the appropriate read instruction may be given with 1-bit standard SPI interface through I/O(0), but subsequent interface for address and data-out may be Quad based (i.e. 4-bit data bus). The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to single SPI, dual SPI, Quad Peripheral Interface ("QPI") and Double Transfer Rate ("DTR") read modes. In the QPI protocol, the complete interface (opcode, address, and data-out) is done on 4-bit basis. In the DTR protocol, the output data is provided on both low-going and high-going CLK edge, rather than providing output data only on low-going CLK edge as in Single Transfer Rate ("STR") read mode operation.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative and may be varied in accordance with the teachings herein, and terms such as "first" and "second" are distinguishing terms and are not to be construed to imply an order or a specific part of the whole. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A NAND flash memory comprising:
an input/output bus; and
a plurality of memory planes arranged in pairs, the memory planes in each pair being configured to be alternatively coupled to the input/output bus;
each of the memory planes comprising an X decoder, a page buffer, and a NAND array comprising a plurality of word lines arranged in rows and coupled to the X-decoder, a plurality of global bit lines coupled to the page buffer, and a plurality of flash memory cells coupled along the rows to the word lines;
the NAND array for each of the memory planes comprising a plurality of partitions through which the global bit lines pass; and
each of the partitions comprising a subset of the word lines, a plurality of local bit lines arranged in columns, and a subset of the flash memory cells arranged in a plurality of strings, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node;
further comprising a first select transistor disposed between each of the local bit lines and the associated global bit line, and a second select transistor disposed between each of the local bit lines and the variable bias node.

2. The NAND flash memory of claim 1 wherein the global bit lines are strapped between the partitions.

3. A NAND flash memory comprising:
an input/output bus; and
a plurality of memory planes arranged in pairs, the memory planes in each pair being configured to be alternatively coupled to the input/output bus;
each of the memory planes comprising an X decoder, a page buffer, and a NAND array comprising a plurality of word lines arranged in rows and coupled to the X-decoder, a plurality of global bit lines coupled to the page buffer, and a plurality of flash memory cells coupled along the rows to the word lines;
the NAND array for each of the memory planes comprising a plurality of partitions through which the global bit lines pass; and
each of the partitions comprising a subset of the word lines, a plurality of local bit lines arranged in columns, and a subset of the flash memory cells arranged in a plurality of strings, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node;
wherein the plurality of memory planes is eight, the plurality of partitions is eight, the plurality of local bit lines associated with each of the global bit lines is four, the subset of flash memory cells arranged in a string is eight, the group of strings associated with each of the local bit lines is about 512, and the plurality of flash memory cells coupled to each of the word lines is about 2K.

4. A NAND flash memory comprising:
an input/output bus; and
a plurality of memory planes arranged in pairs, the memory planes in each pair being configured to be alternatively coupled to the input/output bus;
each of the memory planes comprising an X decoder, a page buffer, and a NAND array comprising a plurality of word lines arranged in rows and coupled to the X-decoder, a plurality of global bit lines coupled to the page buffer, and a plurality of flash memory cells coupled along the rows to the word lines;
the NAND array for each of the memory planes comprising a plurality of partitions through which the global bit lines pass; and
each of the partitions comprising a subset of the word lines, a plurality of local bit lines arranged in columns, and a subset of the flash memory cells arranged in a plurality of strings, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node;
further comprising control logic configured to carry out the steps of:
identifying a selected one of the word lines in accordance with a memory address;
identifying a plurality of strings having flash memory cells coupled to the selected word line;
coupling the identified strings to the respective local bit lines associated therewith;
coupling to each of the global bit lines one of the local bit lines associated therewith and with which one of the identified strings is associated;
coupling to the variable bias node others of the local bit lines having respective ones of the identified strings associated therewith and not coupled to the global bit lines associated therewith;
for each of the global bit lines, establishing either a first bias indicative of a first digital value or a second bias indicative of a second digital value different than the first digital value;
establishing a third bias on the selected word line;
establishing a fourth bias on word lines coupled to cells within the identified strings other than the selected word line, the flash memory cells having channel regions and the flash memory cells in the identified strings having the fourth bias capacitively coupled to the channel regions thereof; and
establishing a fifth bias on the variable bias node;
wherein the third bias and a channel potential established by the first bias are effective to enable tunneling in the flash memory cells;
wherein the third bias and a channel potential established by the second bias and the capacitively coupled fourth bias are effective to disable tunneling in the flash memory cells; and
wherein the third bias and a channel potential established by the fifth bias and the capacitively coupled fourth bias are effective to disable tunneling in the flash memory cells.

5. The NAND flash memory of claim 4 further comprising:
a first select transistor disposed between each of the local bit lines and the associated global bit line, and a second select transistor disposed between each of the local bit lines and the variable bias node;

wherein the step of coupling to each of the global bit lines one of the local bit lines associated therewith and with which one of the identified strings is associated comprises turning on the respective first select transistors and turning off the respective second select transistors; and wherein the step of coupling to the variable bias node others of the local bit lines having respective ones of the identified strings associated therewith and not coupled to the global bit lines associated therewith comprises turning off the respective first select transistors and turning on the respective second select transistors.

6. A NAND flash memory comprising:
an input/output bus;
an X decoder;
a page buffer;
a NAND array comprising a plurality of word lines arranged in rows and coupled to the X-decoder, a plurality of global bit lines coupled to the page buffer, and a plurality of flash memory cells coupled along the rows to the word lines, the flash memory cells being arranges in a plurality of strings;
a plurality of local bit lines arranged in columns, each of the local bit lines having a respective group of the strings associated therewith and respectively configured to be selectively coupled thereto, and each of the global bit lines having a plurality of the local bit lines associated therewith and respectively configured to be selectively coupled thereto or to a variable bias node; and
control logic configured to carry out the steps of:
   identifying a selected one of the word lines in accordance with a memory address;
   identifying a row of the strings having flash memory cells coupled to the selected word line;
   coupling the identified strings to the respective local bit lines associated therewith;
   coupling to each of the global bit lines one of the local bit lines associated therewith and with which one of the identified strings is associated;
   coupling to the variable bias node others of the local bit lines having respective ones of the identified strings associated therewith and not coupled to the global bit lines associated therewith;
   for each of the global bit lines, establishing either a first bias indicative of a first digital value or a second bias indicative of a second digital value different than the first digital value;
   establishing a third bias on the selected word line;
   establishing a fourth bias on word lines coupled to cells within the identified strings other than the selected word line, the flash memory cells having channel regions and the flash memory cells in the identified strings having the fourth bias capacitively coupled to the channel regions thereof; and
   establishing a fifth bias on the variable bias node;
   wherein the third bias and a channel potential established by the first bias are effective to enable tunneling in the flash memory cells;
   wherein the third bias and a channel potential established by the second bias and the capacitively coupled fourth bias are effective to disable tunneling in the flash memory cells; and
   wherein the third bias and a channel potential established by the fifth bias and the capacitively coupled fourth bias are effective to disable tunneling in the flash memory cells.

7. A method of operating a NAND flash memory comprising an X decoder, a page buffer, and a NAND array comprising a plurality of word lines arranged in rows and coupled to the X-decoder, a plurality of global bit lines coupled to the page buffer, and a plurality of flash memory cells arranged in strings and coupled along the rows to the word lines, the method comprising:
   identifying a selected one of the word lines in accordance with a memory address;
   identifying a row of the strings having flash memory cells coupled to the selected word line, the strings being respectively associated with a plurality of local bit lines, and groups of the local bit lines being respectively associated with the global bit lines;
   coupling the identified strings to the respective local bit lines associated therewith;
   coupling to each of the global bit lines one of the local bit lines associated therewith and with which one of the identified strings is associated;
   coupling to the variable bias node others of the local bit lines having respective ones of the identified strings associated therewith and not coupled to the global bit lines associated therewith;
   for each of the global bit lines, establishing either a first bias indicative of a first digital value or a second bias indicative of a second digital value different than the first digital value;
   establishing a third bias on the selected word line;
   establishing a fourth bias on word lines coupled to cells within the identified strings other than the selected word line, the flash memory cells having channel regions and the flash memory cells in the identified strings having the fourth bias capacitively coupled to the channel regions thereof; and
   establishing a fifth bias on the variable bias node;
   wherein the third bias and a channel potential established by the first bias are effective to enable tunneling in the flash memory cells;
   wherein the third bias and a channel potential established by the second bias and the capacitively coupled fourth bias are effective to disable tunneling in the flash memory cells; and
   wherein the third bias and a channel potential established by the fifth bias and the capacitively coupled fourth bias are effective to disable tunneling in the flash memory cells.

8. The NAND flash memory of claim 3 wherein the global bit lines are strapped between the partitions.

9. The NAND flash memory of claim 4 wherein the global bit lines are strapped between the partitions.

* * * * *